United States Patent

Matsumura

[19]

[11] Patent Number: 6,012,929

[45] Date of Patent: Jan. 11, 2000

[54] IC SOCKET STRUCTURE

[75] Inventor: Shigeru Matsumura, Menuma-machi, Japan

[73] Assignee: Advantest Corp., Tokyo, Japan

[21] Appl. No.: 08/817,964

[22] PCT Filed: Nov. 8, 1995

[86] PCT No.: PCT/JP95/02278

§ 371 Date: Sep. 2, 1997

§ 102(e) Date: Sep. 2, 1997

[87] PCT Pub. No.: WO97/17745

PCT Pub. Date: May 15, 1997

[51] Int. Cl.[7] .................................. H01R 9/09
[52] U.S. Cl. .................................. 439/70
[58] Field of Search .................. 439/70–73, 66

[56] References Cited

U.S. PATENT DOCUMENTS

| | | | |
|---|---|---|---|
| 4,593,961 | 6/1986 | Cosmo | 439/66 |
| 4,872,845 | 10/1989 | Korsunsky et al. | 439/330 |
| 5,102,343 | 4/1992 | Knight et al. | 439/67 |
| 5,322,446 | 6/1994 | Cearley-Cabbiness | 439/73 |
| 5,584,707 | 12/1996 | Volz et al. | 439/72 |
| 5,632,626 | 5/1997 | Collins | 439/66 |
| 5,636,996 | 6/1997 | Johnson | 439/66 |

FOREIGN PATENT DOCUMENTS

| | | |
|---|---|---|
| 59-165442 | 9/1984 | Japan . |
| 62-3911 | 1/1987 | Japan . |
| 2-64182 | 5/1990 | Japan . |
| 7-335353 | 12/1995 | Japan . |

*Primary Examiner*—Neil Abrams
*Attorney, Agent, or Firm*—Muramatsu & Associates

[57] ABSTRACT

An IC socket for testing a BGA (Ball grid array) package having a plurality of terminal pins located in a predetermined pitch on a surface of the BGA package. The IC socket includes a plurality of contact blocks each containing a plurality of contact pins in a line with a pin pitch corresponding to that of terminal pins of the BGA package, and a block housing having a plurality of block slots for installing the contact blocks. The contact blocks are lined in rows in accordance with the rows of the terminal pins of the BGA package so that each of the contact pins contained in the contact blocks may contact with each of corresponding terminal pins of the BGA package. The IC socket may further include a package holder for guiding and positioning terminal pins of the BGA package to the positions of the contact pins contained in the contact block.

5 Claims, 3 Drawing Sheets

(A)

(B)

IC SOCKET STRUCTURE

FIELD OF THE INVENTION

This invention relates to a structure of an IC socket, to be used in a semiconductor test system, which is repeatedly connected and disconnected with devices such as a BGA (ball grid array) package type device having a large number of pins.

BACKGROUND OF THE INVENTION

A BGA package is an IC package wherein the leads of a device (DUT) 50 are formed as solder ball terminal pins having the shape of a hemisphere. The number of terminal pins of the BGA package is 100–300 wherein a space between the adjacent pins is, for example, 1.27 mm or 1.0 mm.

An IC test system performs characteristics analysis or go/no-go tests of a DUT 50 through various types of electrical test. For doing the tests, the DUT 50 is mounted on an IC socket to undertake the electrical test and is removed from the IC socket after the tests. Such connection and disconnection between the DUT and the IC socket are performed frequently since a large number of DUTs 50 are tested by an IC test system. Hence, the contact between the DUT 50 and the IC socket gradually will become loose and cause contact problems, or the contact pressure will become too weak to cause a contact instability.

The structure of the contact area of a conventional IC socket used for testing a BGA package type device is explained in the following with reference to FIGS. 3 and 4.

The structure of test-head of the IC test system is composed of a device press mechanism 68 shown in FIG. 3, an IC socket, and a contact board 70 shown in FIG. 4.

The IC socket is composed of a socket housing 62 and a plurality of contact pins 64. The IC socket is mounted on the contact board 70. The DUT 50 is pressed downward against the IC socket by the device press mechanism 68 to establish an electric contact.

The contact pin 64 is a plate spring type pin. The upper terminal of this plate spring pin establishes an electric contact by the contact pressure applied against the hemisphere solder bump of the terminal pin of the DUT 51. In the lower terminal of the contact pin 64, an electric contact is established with a terminal pattern 72 on the surface of the contact board 70 by the contact pressure therebetween. The terminal pattern 72 may also be formed of through holes where the contact board 70 and the lower terminal of the contact pin 64 are connected by means of soldering to form an electric connection.

An overall shape of the contact pin 64 is a vertically arranged plate spring with a curve at its center to create the spring characteristic to maintain electric contact pressure for the lower and upper portions thereof.

This contact pin 64 is integrated to the socket housing 62. The contact pins are arranged in a lattice shape manner at positions which match the corresponding terminal pins 51 of the DUT. Each of the terminal pins 51 contacts with the corresponding terminal pattern 72 directly below the DUT to form an electric contact, thereby the electric connection is established from the lower portion of the contact board 70 to the device test system 80.

Alternatively, an electric contact is formed by a through holes and soldering at a position directly below each of the contact pins 64, thereby establishing an electric connection from the lower portion of the contact board 70 to the device test system 80.

Device press mechanism 68 secures the perfect contact between all of the contact pins 64 and the DUT mounted on the IC socket. The device press mechanism has a structure for downwardly pressing the DUT by, for example, a manual force or air pressure. This downward pressure is set to be considerably high so that all the hemisphere shape pins 51 of the device are securely connected to the contact pins. As a consequence, the spring force of the IC socket tends to be weakened. Thus, there arise contact defects or contact instabilities in the contact pin 64. Such IC sockets involving the contact problems must be immediately exchanged. In general, the contact pins are considered to be disposable since they must be exchanged after the predetermined number of use or the predetermined length of time.

As explained above, the connection and disconnection operations are repeated many times for the IC socket for electrically testing the DUT 50 by the IC test system. Thus, even when there is only one contact pin 64 which shows the defective contact performance or contact instability, the whole IC socket has to be replaced.

When the connection is made through the soldering, the solder has to be removed in order to replace the IC socket and soldering must be applied again for establishing the connection, which increases the time and cost of the replacement.

In addition, since the number of the terminal pins, alignment or pitch of the pins of DUT 50 vary in various ways, many IC sockets corresponding to the various conditions must be prepared accordingly. Thus, the IC sockets cannot be commonly used for varying devices.

Therefore, an object of the present invention is to provide an IC socket structure which can be used for various types of device test by having a structure in which the IC socket is divided in a block by block basis so that defective contact pins can be replaced as a contact block.

SUMMARY OF THE INVENTION

The first embodiment of the present invention is shown in FIG. 1.

To solve the above-mentioned problems, in this invention, a block housing 20 is provided which includes a plurality of block slots 22 for installing therein contact blocks 30. Each of the contact blocks 30 contains a plurality of contact pins 32 in a line with a pin pitch corresponding to that of terminal pins of the device 50.

As a consequence, the contact blocks 30 can be divided and separately taken out from the housing. Hence, only the defective contact block 30 can be easily exchanged.

FIGS. 1 and 2 show the second embodiment of the present invention.

In order to solve the above-mentioned problems, a block housing 20 is provided which includes a plurality of block slots 22 for installing contact blocks 30b. Each of the contact blocks 30b has a core member 36 which is a rubber like elastic material and is wound by a conductive film 38 forming conductive patterns. The conductive patterns are parallel patterns with a very small pitch therebetween. An electric connection is established by pressing the contact blocks 30b against contact electrode pads formed on the surface of a contact board 70.

By this arrangement, since the contact blocks 30b are independent with each other and are not fixed by soldering, the contact block are easily and independently removed from the block housing 20. Thus, only the defective contact block 30b can be replaced. Further, the same contact block 30b can be used without regard to the spacing of the terminal pins of DUT 50.

As an alternative structure, the block housing 20 is provided with a package holder 10 which guides the device 50 for accurately positioning the terminal pins 51 directly below contact pins 32 of the contact block 30.

According to the structure of this invention, since the package holder 10 and the block housing 20 are separated and the DUT 50 is guided by the package holder 10, the block housing 20 can be commonly used for other devices to be tested by adjusting the size of the package holder 10 to the outer shape of the DUT 50.

There is a situation where outer shapes of the devices differ according to the type and manufacturer even when the pin number, pin arrangement and pin spacing are the same. Because of the divided structure of the IC socket of the present invention, even in such a situation, only the package holder 10 has to be replaced, and all the other parts can remain the same.

Because of the divided structure in the block housing 20, in case where the contact failure or contact instability occurs in the contact pins 32, only a contact block 30 which involves such defects can be replaced.

Because of the divided structure, the contact block 30 can be commonly used for DUTs 50 having the same or lesser number of terminal pins in a line as the contact pins in the contact block.

The IC socket structure of the present invention allows a wide range of applications by using a package holder 10, a block housing 20 and contact blocks 30 separately which are combined in various manners to meet the different package shapes, pin numbers, pin arrangements and pin spacings.

In the contact block 30b using a conductive elastomer, a contact block structure with a wide range of applications is available since the contact block 30b can be used without regard to the terminal pitch of the DUT 50.

Since the IC socket is electrically connected by pressing against the contact pads on the contact board, the replacement procedure is made more quickly compared to the one where such connection is made by soldering.

DETAILED DESCRIPTION OF THE PREFERRED EMBODIMENT

The first embodiment of the present invention is explained with reference to the drawings.

Figure 1:
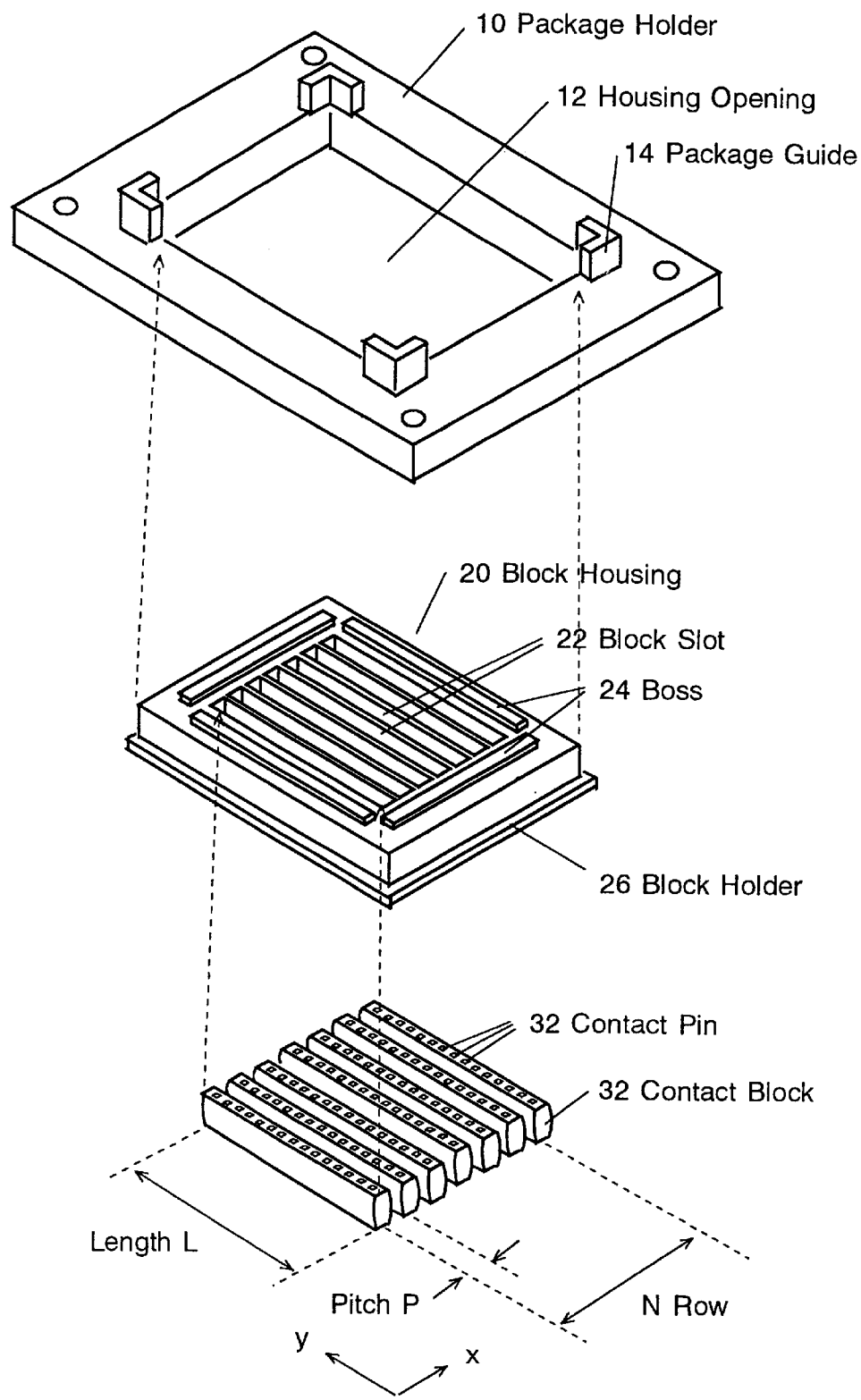
FIG. 1 is a schematic diagram showing a structure of the IC socket of the present invention wherein it is divided into the package holder 10, the block housing 20 and the contact block 30.

The first embodiment of the present invention has a structure in which plate springs are used as contact pins. This structure is explained with reference to FIG. 1.

An IC socket has a structure in which a package holder 10, a block housing 20 and a contact block 30 are separately provided.

The package holder 10 is formed so as to guide the DUT to an accurate position directly above the corresponding contact pin 32 by package guides 14 at four corners of the package holder. The outer shape of the device may vary according to the type of device and manufacturer even when the pin number, pin arrangement and pin spacing are the same. In order to deal with those various shapes, the present invention employs a divided structure.

A housing installation opening 12 of the package holder 10 receives the block housing 20 which is inserted in the opening from the bottom. After the block housing is positioned between the package holder and the contact board 70, an overall assembly is pressed and fixed by screws at four corners.

The block housing 20 is composed of a plurality of block slots 22, a boss 24 and a block holder 26. The block slot 22 is an opening which receives a contact block 30. The number, the length of the block slots 22 and the alignment pitch of the plurality of block slots are determined so that: the number of block slots N matches the number of contact pins in a X direction, the length of block slots matches the number of contact pins M in a Y direction, the pitch between the contact blocks matches the interval of the contact pin.

Figure 4:
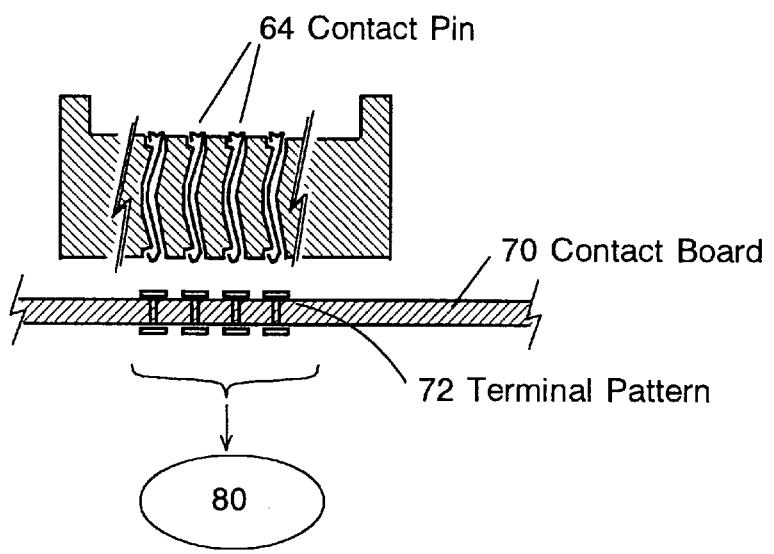
FIG. 4 is a cross sectional view showing a structure of the conventional IC socket using plate springs for contact pins and a conduct board 70.

The boss 24 is a projection surface which functions as a stopper for defining the vertical position of the IC socket when the DUT is pressed downward. In FIG. 4, although the boss has a rectangular shape, other shapes such as cylindrical or conical shape are feasible. The boss may be provided in a plurality of positions. The boss 24 prevents deformation when excessive pressure is applied to the contact pins 32. The block holder 26 is a flange for holding the package holder 10 when the overall assembly is fixed.

The contact block 30 is a structure for storing a plurality of contact pins 32 in a line. Each contact pin 32 is a plate spring type pin as in the conventional example and is integrated to the contact block 30. M or more contact pins are aligned in the Y-direction in the same pin pitch as the M terminal pins of the DUT.

Because of the separated structure of the present invention, various combination of IC sockets for general application can be achieved as shown hereafter. As a first example, it is assumed that the a DUT (A) has 120 terminal pins composed of N=15 lines and M=8 pins per line and a DUT (B) has 180 terminal pins composed of N=15 line and M=12 pins per line. For these DUTs, the block housing 20 having the block slots 22 corresponding to N=15 lines and 12 pins per line is used. And fifteen contact blocks 30 each having 12 pins are also used. Further, the package holder 10 having a shape corresponding to the two kinds of DUTs is provided. In this example, the housing block 20 and contact block 30 can be commonly used for the two kinds of DUTs.

The second embodiment shows an example where the line number N and the pins number M are different. For instance, a DUT (A) has 120 terminal pins by N=15 line and M=8 pins per line, and a DUT (D) has 220 terminal pins by N=20 lines and M=12 pins per line. To share the block housing 20 for these DUTs, the block housing having block slots 22 corresponding to N=20 lines and 12 pins is used. Further, twenty contact blocks 30 each having 12 pins are used. In addition, the package holder 10 having a shape corresponding to the two kinds of DUTs is provided. In this manner, for DUTs with the same pin pitch, the block housing 20 and the contact block 30 can be shared most of the time.

The second embodiment of this invention is explained with reference to the drawings.

Figure 2:
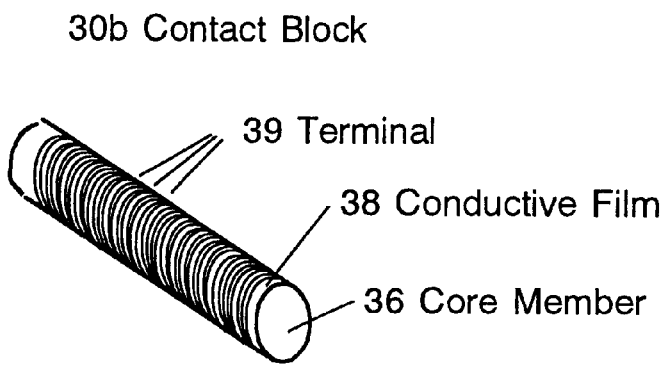
FIG. 2 is a schematic diagram showing a structure of the conduct block 30b of the present invention where an conductive elastomer is used.
Figure 2:
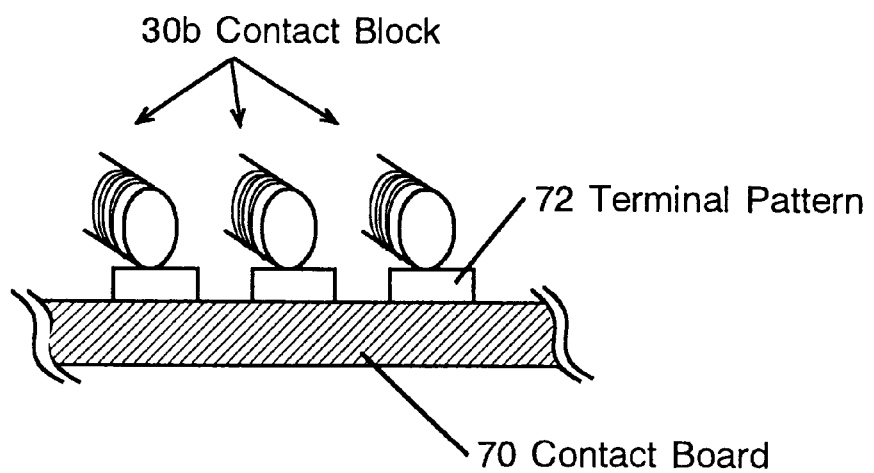
Figure 3:
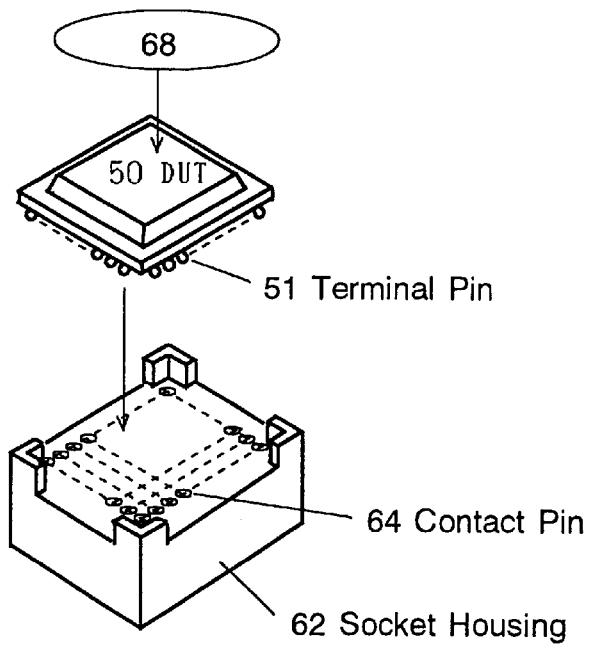
FIG. 3 is a schematic diagram showing a BGA (Ball Grid Array) package, and a conventional IC socket used in the conventional device test system.

The second embodiment of this invention relates to a contact block 30b, as the contact block 30, using a conductive elastomer for the structure of contact pins, which is explained with reference to FIG. 2.

The structure of a package holder 10 and a block housing 20 is the same as that of the first embodiment.

The contact block 30b has a conductive elastomer structure which is composed of a core member 36 and a conductive film 38.

The core member 36 is a rubber elastic material with a cylindrical shape. A thin elastic polyimide film is wound around the core member 36 for forming the conductive film 38. On the surface of this film, a large number of parallel gold copper patterns are formed around the core member 36. This contact block is installed in the block slot 22 of the block housing 20 shown in FIG. 1. In this example, the block housing 20 is structured by insulated substance like resin so that the contact terminals of the contact block 30b will not be short-circuited. Here, the contact terminals are circular conductive patterns for creating an electric connection.

An example of size of the circular conductive terminal 39 is 0.08 mm in conductive pattern width and 0.18 mm in pitch between the conductive patterns. The circular conductive terminals are formed in parallel and insulated from one another to be independent.

Thus, the same contact block 30b can be used as a contact block regardless of the pitches of the terminal pins of the DUT 50 since many conductive terminals 39 are formed with a very small pitch. That is, even if the pitch of the terminal pins 51 and the pitch of the conductive terminals 39 are different, many terminals 39 exist under the pin 51 so that at least one of them contacts the pin of the DUT 50.

The foregoing first and second embodiments are explained for the case in which DUT 50 has the hemispheric shape pins 51 or the lattice aligned pins. However, the three separate structure of the present invention is also applicable to other shapes or alignments of the terminal pins.

The contact 30b can be shared to DUTs of different pin pitches by having the narrow pitch conductive terminals 39 explained above. For example, when the pitch between the terminal pins is 1.27 mm in a DUT (E) and 1.00 mm in a DUT (F) with M=20 pins, the contact block 30b of 1.27 mm×20=25.4 mm which matches to the pitch of the DUT (E) can be commonly used for the both DUTS.

As explained above, the contact block 30b having the length which matches the length of the DUT 50 having the largest number of terminal pins can be commonly used for all the other DUTs 50.

Since it is configured as described in the foregoing, the present invention has the following effects.

When arises a contact defect or contact instability in the contact pin 32, only the contact block 30 having the defective contact pin 32 needs to be exchanged because of the structure that allows free replacement of contact blocks 30. It is not necessary to replace an expensive IC socket as a whole, which reduces the cost in the replacement parts.

The invention also has an advantage that it can deal with various pin numbers and shapes of DUTs with the minimum parts because the IC socket can be divided into three parts which are freely assembled in various combinations. For instance, when the pin number, pin arrangement, and pin spacing are the same, only the package holder 10 corresponding to the package shape is exchanged. In addition, when the pin number M in the Y direction is different, the block housing 20 and the contact block 30 can be used without any change. When the pin number N in the X direction is different, only the package holder 10 is exchanged. Thus, the parts can be shared which can achieve a wide variety of applications. Moreover, it is not necessary to prepare an IC socket for each type of device, thereby significantly decreasing the number of IC socket types to be prepared.

In the case where the contact block 30b having the conductive elastomer, contact terminals with uniform height can be established because of the terminal structure in which the film is wound around the core member 36. As a result, when contacting the DUTs 50, electric contact of high stability is achieved since the identical strength is applied to all of the contact points. The same contact block 30b can be used and shared regardless of the pitches between terminal pins of the soldering bump of the DUT 50 since many contact terminals are provided in a small pitch. Because of the simplicity of the structure, the production cost and the cost of parts can be decreased.

Further, the cost for replacement of the parts can be significantly reduced since the contact pins are pressed by the pressure against the electrode pads on the contact board.

What is claimed is:

1. An IC socket structure for repeatedly connecting and disconnecting a semiconductor device (50) to be tested for performing various electric tests wherein the semiconductor device (50) is in a form of a BGA (ball grid array) package, comprising:

a block housing (20) having a plurality of block slots (22) aligned in the same direction in a parallel fashion;

a plurality of contact blocks (30) each having a plurality of contact pins (32) in a line with a pitch corresponding to a pitch of ball grids (51) of said semiconductor device (50) to be tested, each of said plurality of contact blocks (30) being removably inserted in a corresponding one of said plurality of block slots (22) so that the contact pins (32) being aligned in a matrix fashion; and a package holder (10) for guiding and positioning said semiconductor device (50) to be tested so that said ball grids (51) are accurately connected to the contact pins (32) provided in the contact block (30).

2. An IC socket structure for repeatedly connecting and disconnecting a semiconductor device (50) to be tested for performing various electric tests wherein the semiconductor device (50) is in a form of a BGA (ball grid array) package, comprising:

a plurality of contact blocks (30b) each of which is wound around by a conductive film (38) having parallel conductive patterns with a small pitch on a surface of a core member (36) which is a rubber elastic material, said conductive patterns being electrically separated from each other;

A housing block (20) having a plurality of block slots (22) in the same direction for receiving said plurality of contact block (30b) therein so that said conductive patterns are aligned in a matrix manner; and a package holder (10) for guiding and positioning said semiconductor device (50) to be tested so that said ball grids (51) are accurately connected to the conductive patterns provided on the contact blocks (30b).

3. An IC socket structure as defined in any one of claim 1 or 2, wherein said package holder (10) for guiding and positioning said semiconductor device (50) to be tested has an opening for accommodating said semiconductor device (50) therein and a package guide at a corner of said opening to introduce said semiconductor device (50) through said opening, said package holder being mounted on said block housing.

4. An IC socket for testing a semiconductor device in a BGA (ball grid array) package having a plurality of ball-shaped terminal pins lined in a plurality of rows in a predetermined pitch on a surface of said BGA package, comprising:

a plurality of contact blocks each containing a plurality of contact pins in a line with a pin pitch corresponding to that of the terminal pins of said BGA package;

a block housing having a plurality of block slots aligned in the same direction for installing therein said plurality of contact blocks;

wherein said plurality of contact blocks are removably aligned in said block slots so that a matrix of said contact pins is formed to match with said terminal pins of said BGA package.

5. An IC socket as described in claim 4, further comprising a package holder for guiding and positioning terminal pins of said BGA package to the positions of corresponding contact pins contained in the contact blocks.

\* \* \* \* \*